United States Patent [19]
Suzuki et al.

[11] Patent Number: 5,819,214
[45] Date of Patent: Oct. 6, 1998

[54] LENGTH OF A PROCESSING BLOCK IS RENDERED VARIABLE RESPONSIVE TO INPUT SIGNALS

[75] Inventors: Hiroshi Suzuki, Saitama; Kenzo Akagiri; Osamu Shimoyoshi, both of Kanagawa; Makoto Mitsuno, Chiba, all of Japan

[73] Assignee: Sony Corporation, Tokyo, Japan

[21] Appl. No.: 803,530

[22] Filed: Feb. 20, 1997

Related U.S. Application Data

[60] Continuation of Ser. No. 449,828, May 24, 1995, abandoned, which is a division of Ser. No. 204,872, Mar. 2, 1994, abandoned.

[30] Foreign Application Priority Data

Mar. 9, 1993 [JP] Japan .................................. 5-047944

[51] Int. Cl.⁶ ...................................................... G10L 3/02
[52] U.S. Cl. ........................................................ 704/229
[58] Field of Search .................................. 395/2.12–2.14, 395/2.15, 2.2, 2.21, 2.38, 2.39, 2.36, 2.91–2.95; 375/240; 341/76, 50; 704/203–206, 211, 212, 229, 230, 227, 500–504

[56] References Cited

U.S. PATENT DOCUMENTS

| | | | |
|---|---|---|---|
| 3,349,183 | 10/1967 | Campanella | 179/15.55 |
| 4,184,049 | 1/1980 | Crochiere et al. | 179/1 SA |
| 4,516,241 | 5/1985 | Farah et al. | 370/110.1 |
| 4,535,472 | 8/1985 | Tomcik | 381/31 |
| 4,569,058 | 2/1986 | Grallert | 375/27 |
| 4,573,187 | 2/1986 | Bui et al. | 381/43 |
| 4,622,598 | 11/1986 | Doi et al. | 360/22 |

(List continued on next page.)

FOREIGN PATENT DOCUMENTS

| | | | |
|---|---|---|---|
| 0 289 080 | 11/1988 | European Pat. Off. | H04B 1/66 |
| 0 349 325 A2 | 1/1990 | European Pat. Off. | G11B 20/10 |
| 0 370 277 A3 | 5/1990 | European Pat. Off. | H04B 1/66 |
| 0 423 050 A1 | 4/1991 | European Pat. Off. | H04B 1/66 |
| 0 428 156 A2 | 5/1991 | European Pat. Off. | H03M 7/30 |
| 0 446 031 A3 | 9/1991 | European Pat. Off. | H04B 1/66 |
| 0 458 645 A2 | 11/1991 | European Pat. Off. | H04B 1/66 |
| 0 463 473 A2 | 1/1992 | European Pat. Off. | G06F 15/332 |
| 0 466 190 A2 | 1/1992 | European Pat. Off. | G11B 20/10 |
| 0 473 367 A1 | 3/1992 | European Pat. Off. | H03M 7/30 |
| 0 506 394 A2 | 9/1992 | European Pat. Off. | G10L 7/00 |
| 0 525 809 A2 | 2/1993 | European Pat. Off. | H04B 1/66 |
| WO 90/09064 | 8/1990 | WIPO | H04B 1/66 |
| WO 91/16769 | 10/1991 | WIPO | H04B 1/66 |
| WO 92/17884 | 10/1992 | WIPO | G11B 20/10 |

OTHER PUBLICATIONS

An application–specific FFT processor Electronic Engineering, Jun. 1988, pp. 100 and 104–106.

The ISO Audio Coding Standard, IEEE Global Telecommunications Conference, Dec. 1990, San Diego, CA, by H. Mussmann.

Application of Quadrature Mirror Filters To Split Band Voice Coding Schemes, Esteban et al., 1977 IEEE International Conference on Acoustics, Speech & Signal Processing, pp. 191–195.

Polyphase Quadrature Filters—A New Subband Coding Technique, Rothweiler ICASSP 1983, Boston, vol. 3, pp. 1280–1283.

(List continued on next page.)

*Primary Examiner*—Kee M. Tung
*Attorney, Agent, or Firm*—Limbach & Limbach L.L.P.

[57] ABSTRACT

In a recording/reproducing or transmitting/receiving device for compressed data the temporal size of a processing block during the compression process is rendered variable responsive to larger amplitude changes in the input signals. The device includes power calculating circuits for calculating the masking effect on a processing block based on amplitude changes in the waveform on the time axis of various frequency bands of the processing block and based on the power of a processing block(s) other than the subject processing block. A primary block size decision circuit and a block size correction circuit are utilized to determine the temporal size of the subject processing block.

35 Claims, 13 Drawing Sheets

OTHER PUBLICATIONS

| | | | |
|---|---|---|---|
| 4,625,286 | 11/1986 | Papamichalis et al. | 364/513.5 |
| 4,697,212 | 9/1987 | Osawa et al. | 360/48 |
| 4,706,265 | 11/1987 | Furukawa | 375/122 |
| 4,748,579 | 5/1988 | Zibman et al. | 364/736 |
| 4,873,589 | 10/1989 | Inazawa et al. | 360/53 |
| 4,882,754 | 11/1989 | Weaver et al. | 381/35 |
| 4,885,790 | 12/1989 | McAulay | 381/36 |
| 4,903,301 | 2/1990 | Kondo et al. | 381/30 |
| 4,912,763 | 3/1990 | Galand et al. | 381/31 |
| 4,932,062 | 6/1990 | Hamilton | 381/43 |
| 4,949,383 | 8/1990 | Koh et al. | 381/31 |
| 4,964,166 | 10/1990 | Wilson | 381/34 |
| 5,040,217 | 8/1991 | Brandenburg et al. | 381/47 |
| 5,150,387 | 9/1992 | Yoshikawa | 375/122 |
| 5,159,611 | 10/1992 | Tomita et al. | 375/34 |
| 5,185,800 | 2/1993 | Mahieux | 381/29 |
| 5,204,677 | 4/1993 | Akagiri et al. | 341/118 |
| 5,218,561 | 6/1993 | Twadare | 364/725 |
| 5,222,189 | 6/1993 | Fielder | 395/2 |
| 5,235,671 | 8/1993 | Mazor | 395/2 |
| 5,241,603 | 8/1993 | Akagiri et al. | 381/37 |
| 5,243,588 | 9/1993 | Maeda et al. | 369/54 |
| 5,264,846 | 11/1993 | Oikawa | 341/76 |
| 5,268,685 | 12/1993 | Fujiwara | 341/76 |
| 5,285,476 | 2/1994 | Akagiri et al. | 375/25 |
| 5,294,925 | 3/1994 | Akagiri | 341/50 |
| 5,299,240 | 3/1994 | Iwahashi et al. | 375/122 |
| 5,313,561 | 5/1994 | Akagiri et al. | 375/122 |
| 5,375,189 | 12/1994 | Tsutsui | 395/2.38 |
| 5,381,143 | 1/1995 | Shimoyoshi et al. | 341/51 |
| 5,388,093 | 2/1995 | Yoshida et al. | 369/124 |
| 5,388,209 | 2/1995 | Akagiri | 395/2.38 |
| 5,406,428 | 4/1995 | Suzuki | 360/53 |
| 5,414,795 | 5/1995 | Tsutsui et al. | 395/2.38 |
| 5,438,643 | 8/1995 | Akagiri et al. | 395/2.1 |
| 5,461,378 | 10/1995 | Shimoyoshi et al. | 341/51 |
| 5,471,558 | 11/1995 | Tsutsui | 395/2.28 |
| 5,490,130 | 2/1996 | Akagiri | 369/124 |
| 5,642,383 | 6/1997 | Suzuki | 375/241 |
| 5,654,952 | 8/1997 | Suzuki et al. | 369/124 |
| 5,684,923 | 11/1997 | Suzuki et al. | 395/2.38 |

OTHER PUBLICATIONS

The Critical Band Coder–Digital Encoding of Speech Signals Based on the Perceptual Requirements of the Auditory System, Krasner, 1080 IEEE, vol. 1–3, pp. 327–331.

An Application Specific DSP Chip for 100 MHZ Data Rates, Magar et al., IEEE 1988—pp. 1989–1992.

Perceptual Transform Coding of Wideband Stereo Signals, James D. Johnston, ICASSP '89, vol. 3, pp. 1993–1996.

Patent Abstracts of Japan, vol. 13, No. 285 (E–780), JP 1069181, Fujitsu Ltd.

Signal Compression: Technology Targets and Research Directions, Nikil Jayant, IEEE vol. 10 No. 5, pp. 796–818.

Subband/Transform Coding Using Filter Bank Designs Based on Time Domain Aliasing Cancellation, Princen et al., 1987 ICCC, pp. 2161–2164.

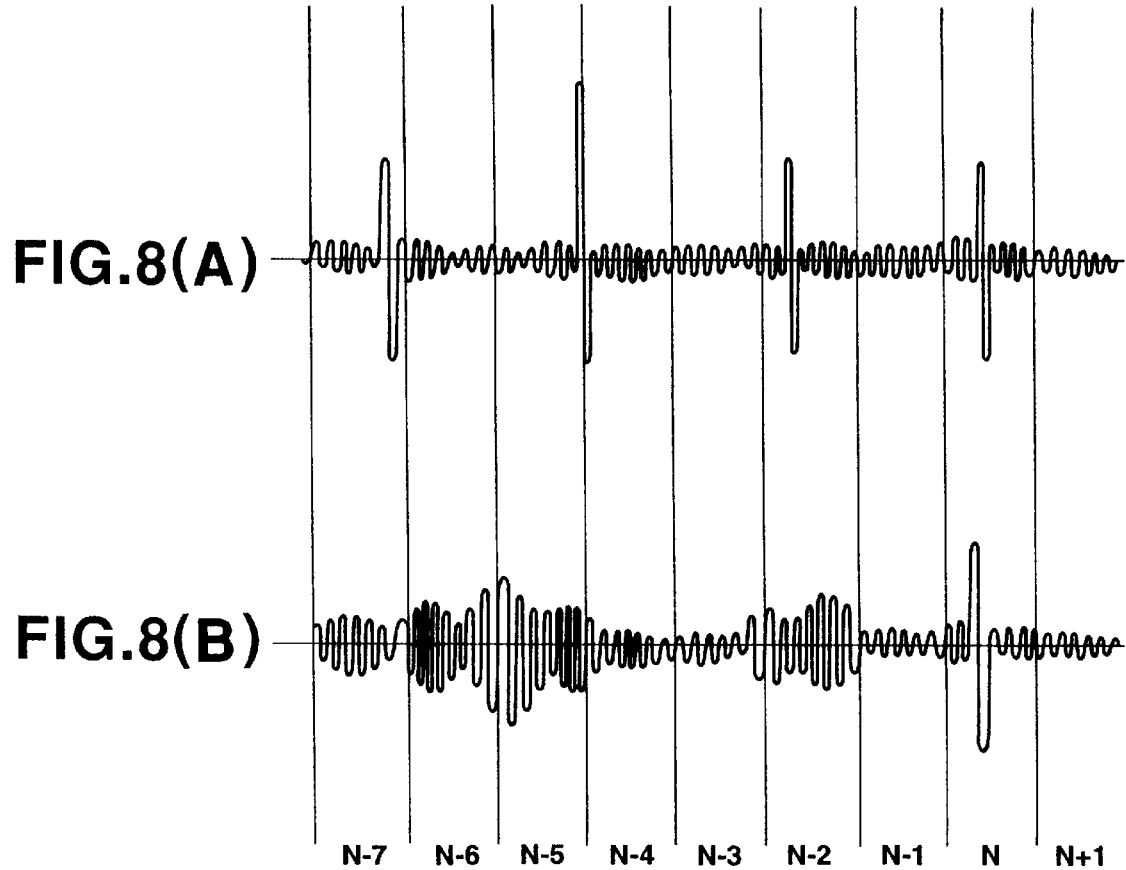

LENGTH OF A PROCESSING BLOCK IS RENDERED VARIABLE RESPONSIVE TO INPUT SIGNALS

This is a continuation of application Ser. No. 08/449,828, filed May 24, 1995 now abandoned which is a divisional of application Ser. No. 08/204,872 filed Mar. 2, 1994 now abandoned.

BACKGROUND OF THE INVENTION

This invention relates to a device for recording and/or reproducing compressed data, that is bit-compressed digital audio signals or the like, a recording medium and a transmission system therefor. More particularly, it relates to a device for recording and/or reproducing or transmitting and/or receiving compressed data in which the temporal size of a processing block for input signals is changed depending on amplitude changes in the waveform of input signals, and a recording medium on which the compressed data is recorded.

The present Assignee has already proposed in our U.S. Pat. Nos. 5,243,588 and 5,244,705 a technique consisting in bit-compressing input digital audio signals and recording the bit-compressed signals in a burst fashion with a pre-set data volume as a recording unit.

This technique resides of employing a magneto-optical disc as a recording medium and recording and/or reproducing AD (adaptive differential) PCM audio data as prescribed in audio data formats such as CD-I (CD-Interactive) or CD-ROM XA. The AD-PCM audio data is recorded in a burst fashion on the magneto-optical disc with e.g. 32 sectors of the AD-PCM data and a few linking sectors for interleaving as one recording unit.

Several modes may be selected of the AD-PCM audio data in the recording and/or reproducing device employing the magneto-optical disc. For example, a level A with a compression ratio twice that of the conventional compact disc (CD) and a sampling frequency of 37.8 kHz, a level B with a compression ratio four times that of the conventional compact disc (CD) and a sampling frequency of 37.8 kHz and a level C with a compression ratio eight times that of the conventional compact disc (CD) and a sampling frequency of 18.9 kHz, are prescribed. That is, with the above-mentioned level B, the digital audio data is compressed to approximately one/fourth of the original volume, with the replay time of the disc recorded with the level B mode being four times of that with the standard CD format. This indicates that the recording/reproducing time about as long as that achieved with a standard size disc of 12 cm in diameter may be achieved with a smaller sized disc and hence the device may be reduced in size.

However, since the rotational speed of the disc is the same as that of a standard CD, the amount of the compressed data obtained with the level B per a pre-set time is four times of that of the standard CD. Consequently, the same compressed data is read in superimposition four times, in a time unit of e.g. a sector or a cluster, and only one of the four superimposed compressed data is transmitted for audio reproduction. Specifically, during scanning or tracking of a spiral recording track, a track jump to return to the starting track position is performed for each revolution for repeatedly tracking the same track four times during reproduction. This indicates that at least one sound compressed data of the four superposed reading operations suffices and hence the disclosed technique is effective against errors caused by disturbances so that it may be desirably applied above all to a small-sized portable type device.

The present Assignee has also proposed in our co-pending U.S. patent application Ser. No. 07/553,608 (filed on Jul. 18, 1990, now U.S. Pat. No. 5,197,087, and U.S. patent application Ser. No. 07/664,300 filed Mar. 4, 1991, which was abandoned in favor of continuing U.S. patent application Ser. No. 08/29,988 filed on Mar. 12, 1993, now U.S. Pat. No. 5,502,789 a technique in which the processing block is changed during the compression process in response to large amplitude changes of the input signals to improve temporal resolution and response characteristics of the processing system.

With this technique, the temporal resolution and the frequency resolution of a processing system, which are contrary to each other, are changed depending upon the properties of input signals for improving adaptability to input signals and producing high sound quality as perceived by the aural sense. For transform coding employing orthogonal transform, as one of numerous high efficiency compression methods, such technique is particularly effective for combatting pre-echo which is produced when input signals having acute changes in signal amplitude are entered. Pre-echo is a phenomenon in which, if signals in an orthogonal transform block are compressed or expanded with orthogonal transform or inverse orthogonal transform while larger amplitude changes are produced within the transform block, the temporally uniform quantization noise is generated in the block so that the quantization noise thus produced becomes objectionable to the aural sense in the small amplitude signal portion that was present before the orthogonal transform or the inverse orthogonal transform.

Meanwhile, if, in the above-described transform coding, the temporal length of the transform block is diminished, the frequency response is lowered due to the properties of the orthogonal transform, thus resulting in the dispersion of the spectrum or orthogonal transform coding. Consequently, if the spectrum or the orthogonal transform coefficients are quantized for signal compression, the bit allocation efficiency is lowered. Therefore, if the temporal duration of the orthogonal transform block is reduced excessively for diminishing the effect of the pre-echo, the quantization noise is increased to such a degree that it can be noticed by the aural sense. For the above reason, the orthogonal transform block size needs to be changed by control adapted to the changes in the input signals. To this end, one may arrive readily at the concept of controlling the orthogonal transform block size with an eye to amplitude changes in the waveform in the time domain, which waveform is an input signal to the orthogonal transform block in subject (the orthogonal transform block for the current input signals). However, the actual input waveform in the time domain is highly complex. Besides, human aural sense characteristics also act as an influencing factor. The result is that, with the above-described technique, the temporal size of the orthogonal transform block tends to be diminished responsive to actual input signals to cause relative deterioration in the sound quality.

OBJECT AND SUMMARY OF THE INVENTION

In view of the above-depicted status of the art, it is a principal object of the present invention to provide a device for recording and/or reproducing or transmitting and/or receiving compressed data for realizing a technique of controlling the orthogonal transform size to optimally adapt to actual complex input signals.

According to the present invention, there is provided a device for recording and/or reproducing or transmitting and/or receiving compressed data in which, during compression and/or expansion of digital signals, the length of a processing block in subject is rendered variable responsive to input signals, wherein the length of a processing block in subject is set based on the information on changes and/or the power, energy or the peak of the input signals of the processing block in subject and other processing blocks, for preventing the temporal length of the processing block from being decreased in an amount which is more than is necessary.

In addition, by analyzing not only the information of the processing block in subject and the processing blocks temporally neighboring to the processing block, but also the information of plural processing blocks temporally preceding the processing block in subject, it becomes possible to take into account the periodic changes or features continuing for a longer time duration than that of the processing block of the current input signals in selecting the temporal size of the processing block of the current input signals for producing the optimum sound quality as perceived by the ears.

The technique of the present invention is effective for optimum compatibility between the high sound quality as perceived by the ears and the efficient reduction in the effect of the pre-echo in the transform coding. However, it is similarly effective in any other high efficiency coding method in establishing optimum compatibility between the frequency resolution and the temporal resolution.

With the device for recording and/or reproducing or transmitting and/or receiving compressed data according to the present invention, there is no fear of selecting a block of temporal length shorter than is necessary when changing the temporal size and the window shape of the orthogonal transform block responsive to acute amplitude changes of the input signals, such that a more satisfactory sound quality may be achieved for the same bit rate or the lower bit rate may be employed for recording or transmission for the same sound quality.

BRIEF DESCRIPTION OF THE DRAWINGS

FIGS. 8(A) and 8(b) show the effect of relating the information concerning the changes in input signals over plural processing blocks with the block decision among the functions of the block decision circuit.

DETAILED DESCRIPTION OF THE PREFERRED EMBODIMENT

Figure 1:
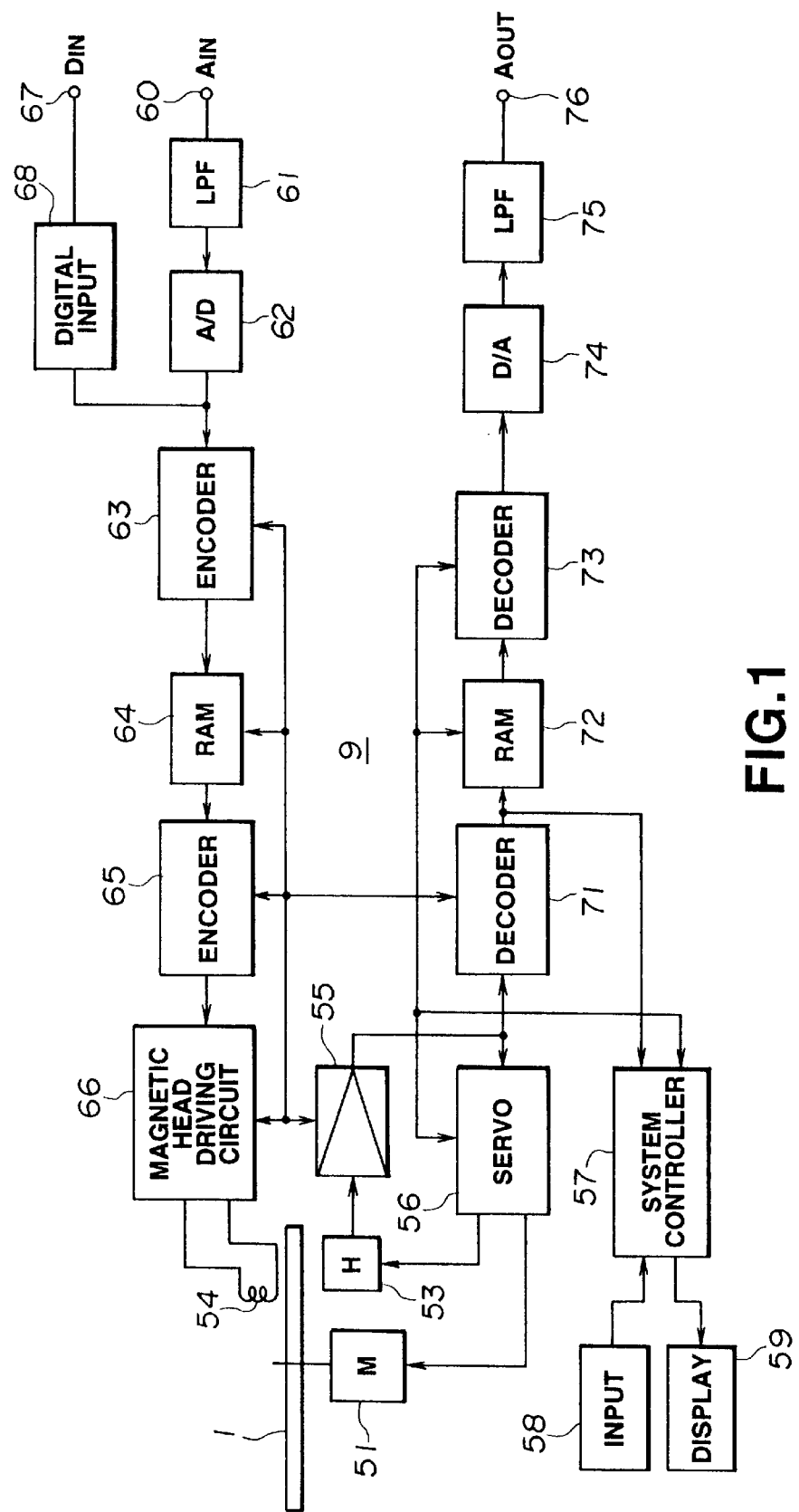
FIG. 1 is a block circuit diagram showing a arrangement of a disc recording and/or reproducing device embodying a recording and/or reproducing device for compressed data according to the present invention.

Referring to the drawings, a preferred embodiment of the present invention will be explained in detail.

In FIG. 1, there is shown a schematic arrangement of an embodiment of the recording and/or reproducing device for compressed data of the present invention in a block circuit diagram.

In the magneto-optical disc recording/replay unit of the compressed data recording and/or reproducing device, shown in FIG. 1, a magneto-optical disc 1 run into rotation by a spindle motor 51 is employed as a recording medium. In recording data on the magneto-optical disc 1, a modulated magnetic field corresponding to the recording data is applied by a magnetic head 54, while the magneto-optical disc 1 is irradiated with a laser light beam by the optical head 53, by way of performing the recording by magnetic field modulation for recording data along a recording track of the magneto-optical disc 1. In reproducing the recorded data, the recording track on the magneto-optical disc 1 is traced by a laser light beam for reproduction photomagnetically.

The optical head 53 is made up of a laser light source, such as a laser diode, optical components, such as a collimator lens, an objective lens, a polarized light beam splitter or a cylindrical lens, and a photodetector having a light receiving section having a pre-set pattern. The optical head 53 is placed at a position facing the magnetic head 54 with the magneto-optical disc 1 in-between. For recording data on the magneto-optical disc 1, the magnetic head 54 is driven by a head driving circuit 66 of a recording system as later explained for applying a modulated magnetic field corresponding to the recording data to the disc 1, while a laser light beam is radiated by the optical head 53 on a target track of the magneto-optical disc 1 for thermo-magnetic recording in accordance with magnetic field modulation. In addition, the optical head 53 detects the reflected laser light from the target track for detecting the focusing error by an astigmatic method, while detecting the tracking error by a push-pull method. When reproducing data from the magneto-optical disc 1, the optical head 53 detects the focusing error or the tracking error, while also detecting the difference in the angle of polarization (the Kerr rotation angle) of the reflected light from the target track for generating the playback signals.

An output of the optical head 53 is supplied to an RF circuit 55 which extracts the above-mentioned focusing error signals and the tracking error signals from an output of the optical head 53 to transmit the extracted signals to a servo control circuit 56. The RF circuit 55 also converts the replay signals into bi-level signals which are supplied to a decoder 71 of the reproducing system as later explained.

The servo control circuit 56 is made up of, for example, a focusing servo control circuit, a tracking servo control circuit, a spindle servo control circuit, a thread servo control circuit and so forth. The servo control circuit focusing controls focusing of the optical head 53 so that the focusing signal is reduced to zero. The tracking servo control circuit controls the tracking of the optical head 53 so that the tracking signal is reduced to zero. The spindle motor servo controlling circuit controls the spindle motor 51 for running the magneto-optical disc 1 into rotation at a pre-set rotational velocity, for example, at a constant linear velocity. The thread servo control circuit shifts the optical head 53 and the magnetic head 54 to a target track position of the magneto-optical disc 1 as designated by a system controller 57. The servo control circuit 56 transmits the information indicating the operating states of the various components controlled by the servo control circuit 56 to the system controller 57.

A key input unit 58 and a display 59 are connected to the system controller 57 which controls the recording system and the reproducing system under the operating mode as designated by the input information entered at the key input unit 58. The system controller 57 also supervises the recording position and the replay position on the recording track traced by the optical head 53 and the magnetic head 54 based on the sector-based address information reproduced from the recording track of the magneto-optical disc 1 by Q-data such as header time or sub-code data. In addition, the system controller 57 causes the replay time to be displayed on the display 59 based on the data compression ratio in the bit compression mode and the playback position information on the recording track.

For playback time display, the sector-based address information (absolute time information) reproduced from the recording track of the magneto-optical disc 1 by header time or sub-code Q data is multiplied by a reciprocal of the data compression ratio for the bit compression mode, such as 4 for the bit compression ratio of 1/4, to find the actual time information, which is displayed on the display 59. Meanwhile, during recording, if the absolute time information is pre-recorded on the recording track of the magneto-optical disc 1, that is if the magneto-optical disc 1 is pre-formatted, it is possible to display the current position by the actual recording time by reading the pre-formatted absolute time information and multiplying it with a reciprocal of the data compression ratio.

In a recording system of the present disc recording/reproducing device, analog audio input signals AIN are supplied from an input terminal 60 via a low-pass filter 61 to an A/D converter 62 which quantizes the analog audio input signals AIN. Digital audio signals produced by the A/D converter 62 are supplied to an adaptive transform coding (ATC) PCM encoder 63. Alternatively, the digital audio input signals DIN from an input terminal 67 are supplied via an input interfacing circuit 68 to the ATC encoder 63 in which bit compression or data compression is performed on the digital audio PCM data of a preset transfer speed which is the input signal AIN quantized by the A/D converter 62. Although the following description is made in connection with the compression rate of four, the present embodiment is not dependent on a specific value of compression rate which may be set to desired values depending on the particular applications.

The memory 64 is a buffer memory which is controlled as to data writing and data reading by the system controller 57 for transiently storing ATC data supplied from the ATC encoder 63 for recording on the disc when the necessity arises. That is, the compressed audio data supplied from the ATC encoder 63 has its data transfer rate diminished to one-fourth of the data transfer rate for the standard CD-DA format of 75 sector per sec, or to 18.75 sectors per sec. The compressed data is written continuously into the memory 64. Although it suffices to record the compressed data (ATC data) at a rate of one per eight sectors, as mentioned above, such recording at every eight sectors is practically impossible, so that sector-continuous recording is performed, as later explained. This recording is performed in a burst fashion at the data transfer rate of 75 sectors per sec, which is the same as the standard CD-DA format, with a cluster made up of pre-set plural sectors, for example, 32+several sectors, as a recording unit, with the interposition of a non-recording period. That is, in the memory 64, the stereo B mode ATC audio data, continuously written at a low transfer rate of 9.375 (=75/8) sectors per sec associated with the bit compression mode, is read as the recorded data in a burst fashion at the above-mentioned transfer rate of 75 sectors per sec. The overall data transfer rate of the data read out and recorded, inclusive of the non-recording period, is the low rate of 18.75 sectors per sec. However, the instantaneous data transfer rate within the time period of the recording operation performed in a burst fashion is the above-mentioned standard data transfer rate of 75 sectors per sec. Therefore, if the disc rotating velocity is the same as that of the standard CD-DA format, that is a constant linear velocity, recording is made at the same recording density and with the same recording pattern as those of the CD-DA format.

The ATC audio data read from the memory 64 at the above-mentioned instantaneous transfer rate of 75 sectors per sec, that is the recorded data, are supplied to an encoder 65. The unit by which the data string supplied from the memory 64 to the encoder 65 is recorded for each recording is a cluster consisting of plural sectors, such as 32 sectors, and several cluster-linking sectors arrayed ahead and at back of the cluster. The cluster-linking sectors are selected to be longer than an interleaving length at the encoder 65 so that data of neighboring clusters are not affected by data interleaving.

The encoder 65 performs encoding for error correction, such as parity appendage and data interleaving, or EFM encoding, on the recording data supplied from the memory 64 in the burst fashion. The recorded data encoded by the encoder 65 is supplied to a magnetic head driving circuit 66. The magnetic head 54 is connected to the magnetic head driving circuit 66 which drives the magnetic head 54 for applying the modulated magnetic field corresponding to the recording data to the magneto-optical disc 1.

The system controller 57, controlling the memory 64 as described above, also controls the recording position in such a manner that the recorded data read in the burst fashion by the memory control is continuously recorded on the recording track of the magneto-optical disc 1. The recording position is controlled by supervising the recording position of the recorded data read in the burst fashion by the system controller 57 from the memory 64 and by supplying a control signal designating the recording position on the recording track of the magneto-optical disc 1 to the servo control circuit 56.

The reproducing system of the recording/reproducing unit for the magneto-optical disc 1 is hereinafter explained.

The reproducing system is employed for reproducing the recorded data continuously recorded on the recording track of the magneto-optical disc 1, and includes a decoder 71 to which a playback output produced on tracing the recording track of the magneto-optical disc 1 with a laser light beam from the optical head 53 is supplied after conversion into bi-level data by the RF circuit 55. Recorded data may be read not only from the magneto-optical disc 1 but also from the replay-only optical disc of the same type as the so-called compact disc.

The decoder 71 is a counterpart of the encoder 65 of the above-described recording system and performs the above-mentioned decoding for error correction or EFM decoding on the bi-level playback output of the RF circuit 55, while reproducing the ATC audio data at a transfer rate of 75 sectors per sec which is faster than the normal transfer rate. The playback data obtained by the decoder 71 is supplied to a memory 72.

The memory 72 has its data writing and reading controlled by the system controller 57 in such a manner that the playback data supplied from the decoder 71 at the transfer rate of 75 sectors per sec is written therein in the burst fashion at the transfer rate of 75 sectors per sec. On the other hand, the playback data written in the burst fashion at the transfer rate of 75 sectors per sec in the memory 72 is continuously read from the memory 72 at the normal transfer rate of 18.75 sectors per sec.

The system controller 57 controls the memory 72 in such a manner as to write the replay data in the memory 72 at the transfer rate of 75 sectors per sec and to continuously read the replay data from the memory 72 at the above-mentioned transfer rate of 18.75 sectors per sec. The system controller 57, controlling the memory 72 as described above, controls the replay position in such a manner that the replay data written in a burst fashion from the memory 72 under control by the system controller 57 is continuously reproduced from the recording track of the magneto-optical disc 1. The replay position is controlled in such a manner that the replay position of the replay data read in the burst fashion from the memory 72 is supervised by the system controller 57 and a control signal designating the replay position on the recording track of the magneto-optical disc 1 or the optical disc is transmitted to the servo control circuit 56.

The ATC audio data obtained as the replay data continuously read from the memory 72 at the transfer rate of 18.75 sectors per sec is supplied to an ATC decoder 73. The ATC decoder 73 expands the ATC data by a factor of eight by way of bit expansion for reproducing 16-bit digital audio data. The digital audio data from the ATC decoder 73 is supplied to a D/A converter 74.

The D/A converter 74 translates the digital audio data supplied from the ATC decoder 73 into analog signals for forming analog audio output signals AOUT. The analog audio output signals AOUT are outputted at an output terminal 76 via a low-pass filter 75.

The high efficiency compression and encoding is explained in detail.

Figure 2:
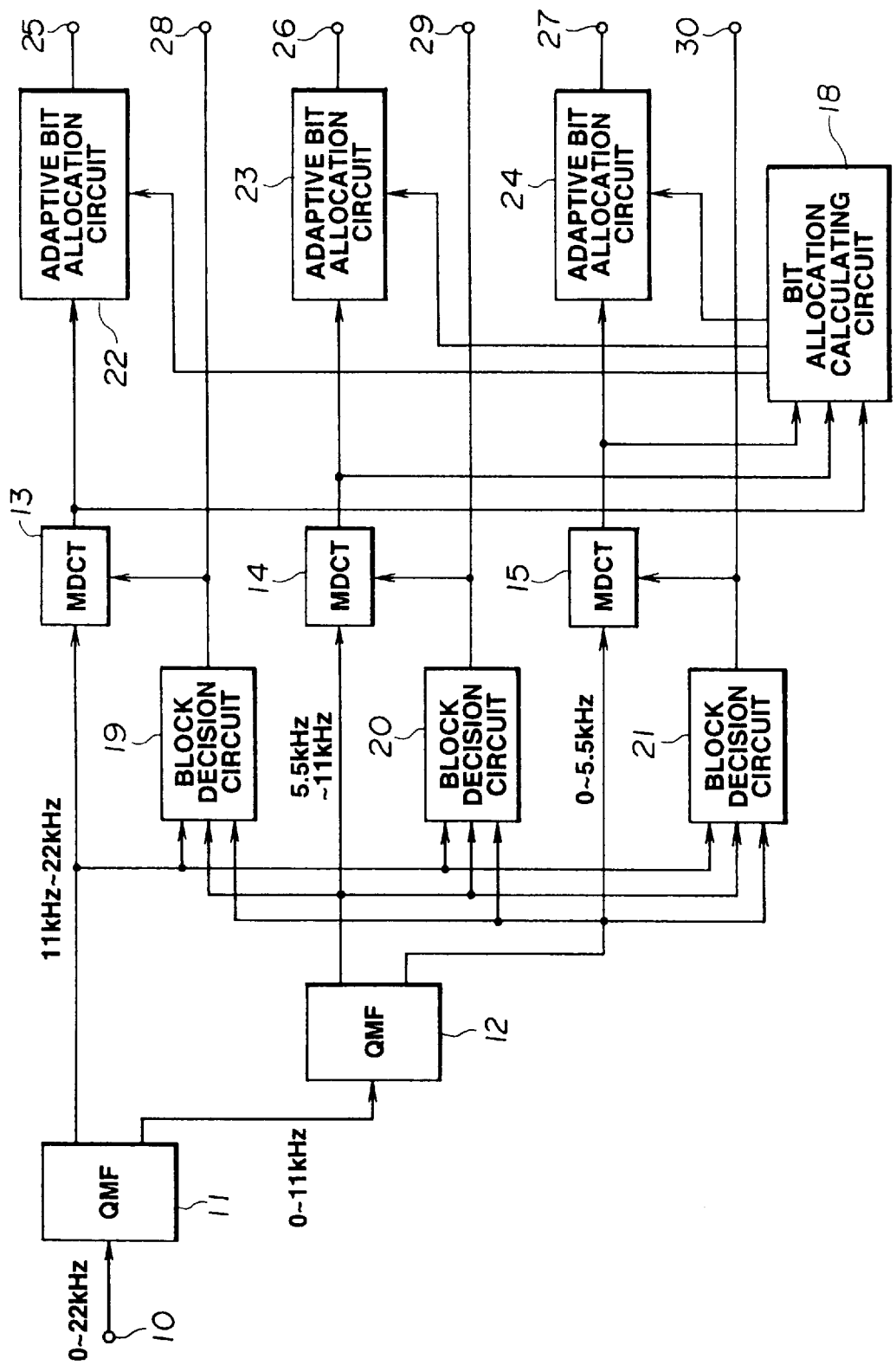
FIG. 2 is a block circuit diagram showing a concrete example of a high efficiency compression coding encoder that may be used for bit rate compression coding by the embodiment shown in FIG. 1.
Figure 3A:
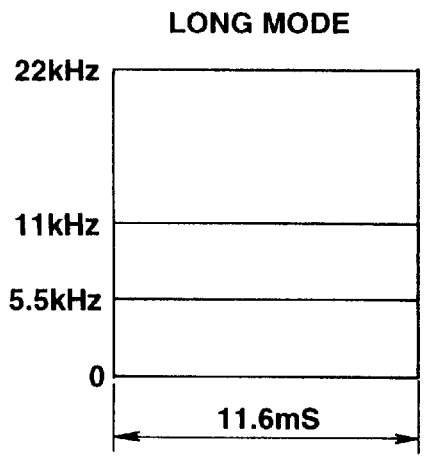
FIGS. 3(A), 3(B) 3(C) and 3(D) show the construction of orthogonal transform blocks for bit compression.
Figure 3B:
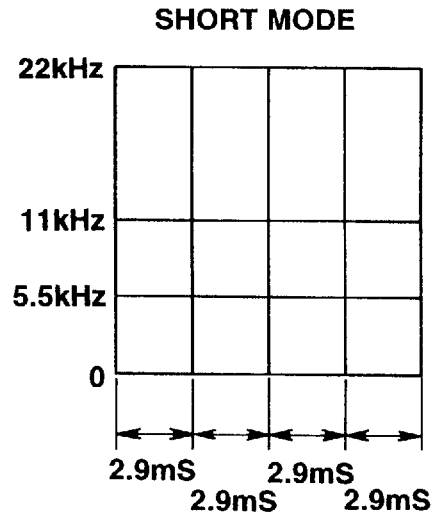
Figure 3C:
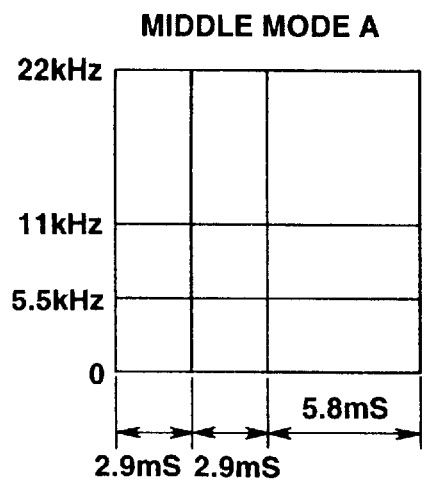
Figure 3D:
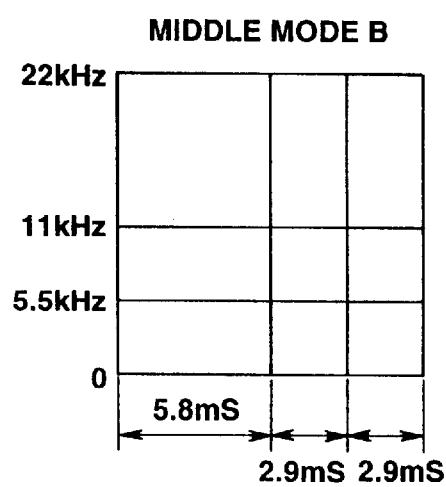

That is, the technique of performing high efficiency encoding on input digital signals, such as audio PCM signals, by sub-band coding (SBC), adaptive transform coding (ATC) and adaptive bit allocation, is explained by referring to FIG. 2.

In the concrete high-efficiency encoding device, shown in FIG. 2, the frequency range of the input digital signals is divided into plural frequency bands so that two neighboring lower most bands are of an equal bandwidth and the bandwidths become progressively broader in the direction of increasing frequencies. The input digital signals are orthogonally transformed from one frequency band to another to produce frequency-domain spectral data which is encoded with the numbers of bits which are adaptively allocated on the basis of so-called critical bands for the lower frequency range for taking into account the characteristics of the human aural sense as later explained and on the basis of smaller width bands sub-divided from the critical bands for the higher frequency range for raising the block floating efficiency. This block usually becomes the block subject to the quantization noise, that is the block based on which the quantization noise is produced. Furthermore, with the present embodiment, the block size or block length is adaptively changed prior to orthogonal transform depending on input signals, and floating is performed on the block basis.

Referring to FIG. 2, audio PCM signals having a frequency range of 0 to 22 kHz, with the sampling frequency of 44.1 kHz, are supplied to an input terminal 10. These input signals are divided by a frequency dividing filter 11, such as, for example, a QMF filter, into signals having a frequency range of 0 to 11 kHz and a frequency range of 11 to 22 kHz. The signals having the frequency range of 0 to 11 kHz are similarly divided by a similar frequency dividing filter 12, such as a QMF filter, into signals having a frequency band of 0 to 5.5 kHz and signals having a frequency band of 5.5 kHz to 11 kHz. The signals in the range of 11 to 22 kHz from the frequency dividing filter 11 are transmitted to an MDCT circuit 13, which is a kind of the orthogonal transform circuit, for MDCT processing. Similarly, the signals in the range of 5.5 to 11 kHz from the frequency dividing filter 12 are transmitted to an MDCT circuit 14, while the signals in the range of 0 to 5.5 kHz from the frequency dividing filter 12 are transmitted to an MDCT circuit 15, for MDCT processing.

Among the techniques of dividing the above-mentioned input digital signals into plural frequency bands, there is a QMF filter, for example, as discussed in 1976 R. E. Crochiere Digital Coding of Speech in Sub-bands Bell Syst. Tech. J. Vol. 55 No. 8 1976. The technique of filter division into equal bandwidths is discussed in ICASSP 83, BOSTON Polyphase Quadrature Filters—A New Sub-band Coding Technique Joseph H. Rothweiler.

As an example of the above-described orthogonal transform, there is an such orthogonal transform in which input audio signals are divided into time blocks of pre-set length (frames) and processed with fast Fourier transform (FFT), cosine transform (DCT) or modified DCT (MDCT) for transformation of time-domain signals into frequency-domain signals. Discussions on MDCT may be found in ICASSP 1987 Sub-band/Transform Coding Using Filter Bank Designs Based on Time Domain Aliasing Cancellation J. P. Princen, A. B. Bradley Univ. of Surrey, Royal Melbourne Inst. of Tech.

FIGS. 3(A), 3(B), 3(C) and 3(D) show concrete examples of standard input signals in band-based blocks supplied to the MDCT circuits 13 to 15.

In the concrete example of FIG. 3, each of three filter output signals has plural orthogonal block sizes independently in each band and is adapted to be changed over as to the temporal resolution depending on e.g. temporal characteristics or the frequency distribution of the filter output signals. If the signals are temporally pseudo-stationary, the orthogonal transform block size is set to a larger value of 11.6 ms, that is to a long mode shown in FIG. 3(A), whereas, if the signals are non-stationary, the orthogonal block size is further divided by factors of two or four. By further dividing the block size into four parts (short mode), with each part being 2.9 ms, as shown in FIG. 3(B), or dividing the block size partially into two parts, with the part being 5.8 ms, and partially into four parts, with each part being 2.9 ms (middle mode), as shown in FIGS. 3(C) and 3(D), complex input signals as actually encountered may be accommodated fairly satisfactorily. Further complex division of the orthogonal block size is evidently more effective insofar as the processing device scale permits. The block size decision is made in the block size decision circuits 19, 20 and 21 and transmitted to the MDCT circuits 13, 14 and 15, while being outputted at output terminals 28, 29 and 30 as the block size information of the respective blocks.

Figure 4:
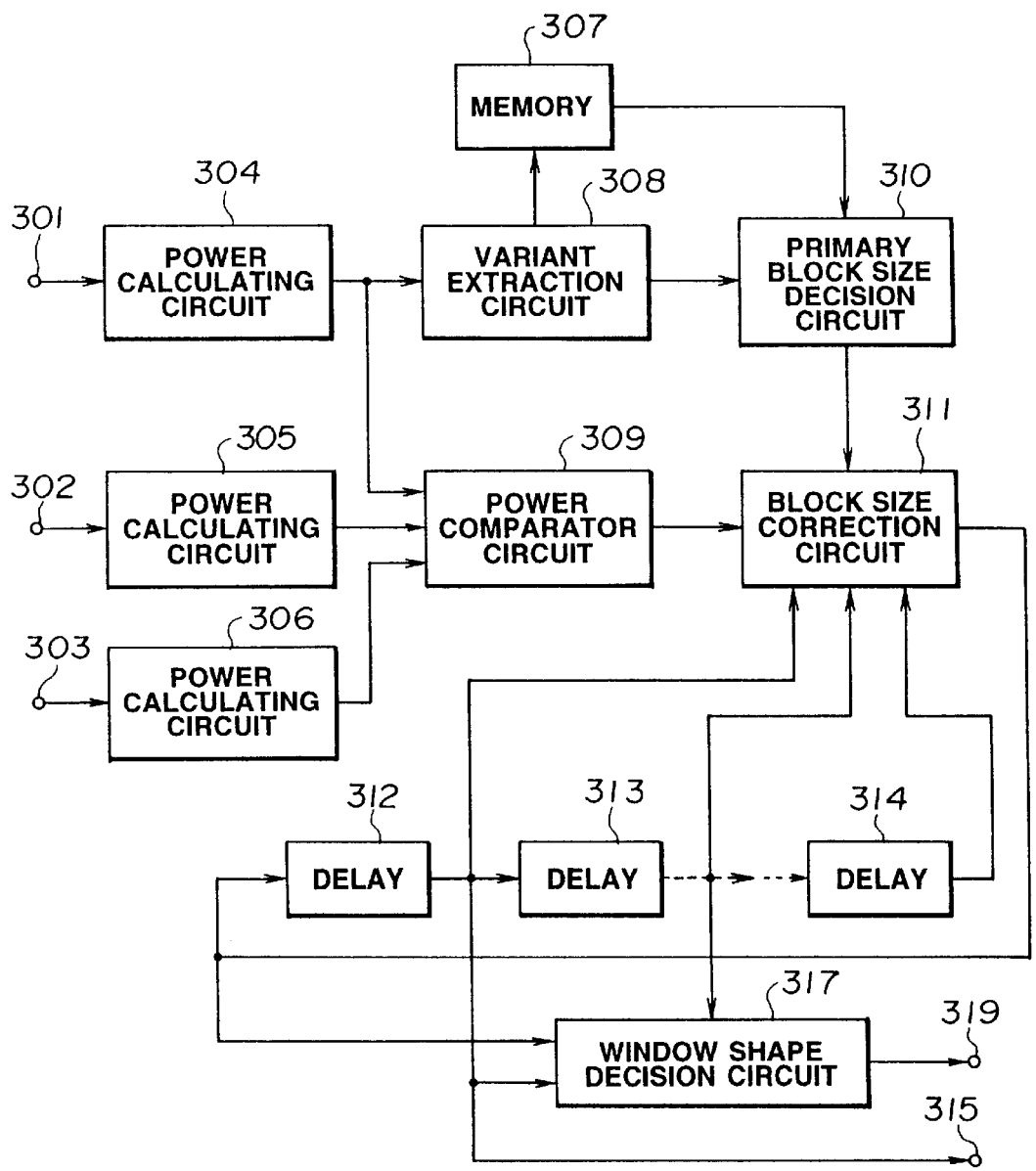
FIG. 4 is a block circuit diagram showing an arrangement of a circuit for deciding the orthogonal transform block size.

The block size decision circuits are shown in detail in FIG. 4. The block decision circuit 19 shown in FIG. 2 is taken as an example. Of the outputs of the frequency dividing filter 11 shown in FIG. 2, the output in the range of 11 to 22 kHz is supplied via an input terminal 301 in FIG. 4 to a power calculating circuit 304, while the output in the range of 5.5 to 11 kHz is supplied via an input terminal 302 in FIG. 4 to a power calculating circuit 305 and the output in the range of 0 to 5.5 kHz is supplied via an input terminal 303 in FIG. 4 to a power calculating circuit 306.

The block size decision circuits 20, 21 are the same in operation as the block size decision circuit 19, except that the signals entered at the input terminals 301 to 303 are different from those of the decision circuit 19. The input terminals 301 to 303 in each of the block size decision circuits 19 to 21 are of a matrix configuration in the sense that the 5.5 kHz to 11 kHz output and the 0 kHz to 5.5 kHz output are connected to the input terminals 301 and 302 of the block size decision circuit 20, respectively. The same may be said of the block size decision circuit 21.

In FIG. 4, the power calculating circuits 304, 305 and 306 find the powers in the respective bands by integrating the input temporal waveforms for a pre-set time duration. The integration time duration needs to be shorter than the minimum time block of the above-mentioned block sizes. Besides the above calculating method, the absolute value of the maximum amplitude or the mean value of the amplitudes in a minimum time width of the orthogonal block sizes may also be employed as the representative power value. An output of the power calculating circuit 304 is supplied to a variant extraction circuit 308 and a power comparator circuit 309, while outputs of the power calculating circuits 305, 306 are supplied to a power comparator circuit 309.

The variant extracting circuit 308 finds the differential coefficient of the power supplied from the power calculating circuit 304 to supply the coefficient thus found to the primary block size decision circuit 310 and to the memory 307 as the power variant information. The memory 307 stores the power variation information supplied from the extraction circuit 308 for a time duration longer than the maximum time duration of the above-mentioned orthogonal transform block sizes, because the temporally consecutive orthogonal transform blocks affect one another by the windowing operation during the orthogonal transform and hence the power variation information of the immediately temporally preceding block is required by the primary block size decision circuit 310. Based on the power variation information of the block in subject, supplied from the variant extracting circuit 308, and the power variation information for the immediately preceding block from the memory 307, the primary block size decision circuit 310 finds the orthogonal transform block size for the relevant frequency band from the temporal variation of the power within the relevant frequency band. If the variation in excess of a pre-set value is produced, the orthogonal transform block size of a shorter time duration is selected. However, similar effects may also be produced if the point of variation remains fixed. More favorable effects could be obtained by setting the block size so as to be proportionate to the frequency in such a manner that the block size is of shorter time duration with a larger variation for a higher frequency and of a shorter time duration with a smaller variation for a lower frequency. Although smooth transition is desirable, plural step-like changes may also be tolerated. The block sizes determined as described above are transmitted to a block size correction circuit 311.

On the other hand, the power comparator circuit 309 compares the band-based power data from the power calculating circuits 304 to 306 both concurrently and for a time duration during which the masking effect is manifested on the time axis to find the effect on the output band of the power calculating circuit by the other bands to transmit the effect to the block size correction circuit 311.

Based on the masking information supplied from the power comparator circuit 309 and on the past block size information supplied from the taps of groups of delay units 312 to 314, the block size correction circuit 311 corrects the block size so that a block size longer than the block size supplied from the primary block size decision circuit 310 is selected, and transmits the selected block size to the delay units 312 and to a window shape decision circuit 317. The operation by the block size correction circuit 311 is based on the fact that, if an objectionable pre-echo is produced in a given frequency band, but there exists a signal of a larger amplitude in other frequency bands, above all, in a frequency band lower in frequency than the given frequency band, the pre-echo may become imperceptible by the masking effect, or may become less objectionable.

The masking means the phenomenon in which certain signals are masked by other signals and become inaudible due to characteristics of the human aural sense. The masking effect may be classified into time-domain masking effect produced by the time-domain audio signals and concurrent masking effect produced by the frequency-domain signals. By this masking, any noise present in a masked portion becomes inaudible. In actual audio signals, the noise within the masked range is an allowable noise.

The groups of the delay units 312 to 314 store the past orthogonal transform block sizes sequentially and output the stored block size values to the block size decision circuit 311. Simultaneously, outputs of the delay units 312 are coupled to an output terminal 315, while outputs of the delay units 312, 313 are coupled to the window shape decision circuit 317. The outputs of the delay units 312 to 314 play the role of enabling the block size change of a longer time duration to be utilized in the block size correction circuit 311 in deciding the block size. For example, if the block sizes of short time durations are selected frequently in the past, the block sizes of short time duration are enabled to be selected, whereas, if the block sizes of short time durations are not selected in the past, the block sizes of longer time duration are enabled to be selected. Meanwhile, except for the delay units 312, 313 associated with the window decision circuit 317 and the output terminal 315, the number of taps of the delay units may occasionally be increased or decreased depending on the arrangement and scale of the actual device.

The window shape decision circuit 317 selects from the output of the block size correction circuit 311, that is from the block size of the block directly temporally succeeding the relevant block, the output of the delay unit 312, that is the block size of the block in subject, and the output of the delay unit 313, that is the block size of the block directly temporally preceding the relevant block, the shape of the window employed by the MDCT circuits 13 to 15 shown in FIG.2, and outputs the window shape thus selected at an output terminal 319. The block size information at the output terminal 315 and the window shape information at the output terminal 319 are supplied to various components of the device as outputs of the block size decision circuits 19 to 21.

The shape of the window as selected by the window shape decision circuit 317 is hereinafter explained.

Figure 5A:
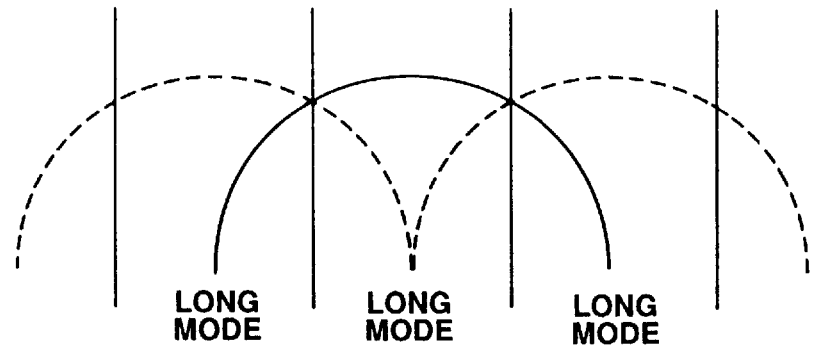
FIGS. 5a, 5b and 5c show the relation between changes in the temporal length of temporally consecutive orthogonal transform blocks and the window shape employed for orthogonal transform.
Figure 5B:
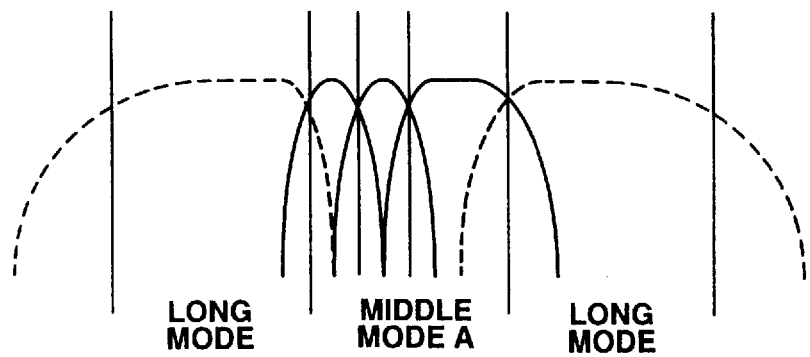
Figure 5C:
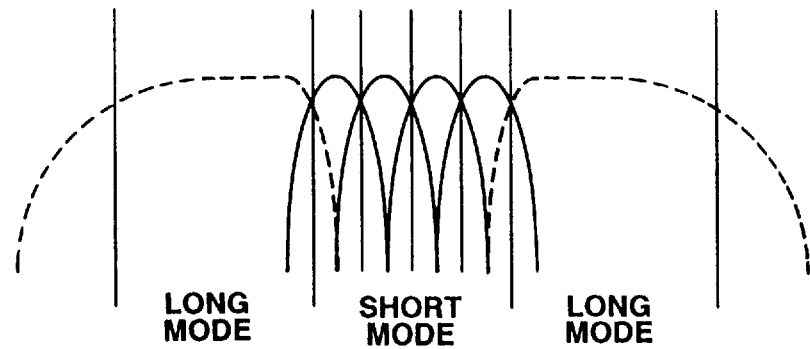

FIGS. 5a to 5c show the window shapes in conjunction with neighboring blocks. The windows employed for orthogonal transform have portions overlapping with each other between temporally neighboring blocks, as indicated by solid and broken lines in FIG. 5a to 5c. Since the overlapping shapes up to the center of the neighboring blocks are used in the present embodiment, the window shape is changed depending on the orthogonal transform sizes of the temporally neighboring blocks.

Figure 6:
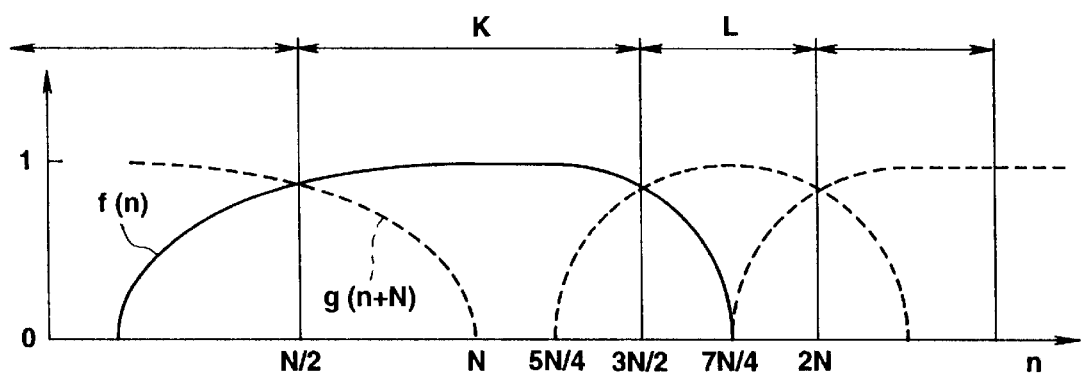
FIG. 6 shows a detailed window shape employed for orthogonal transform.

FIG. 6 shows details of the window shape. In FIG. 6, a window functions f(n) and g(n+N) are given as functions satisfying the following equations (i):

$$f(n) \times f(L-1-n) = g(n) \times g(L-1-n)$$

$$f(n) \times f(n) + g(n) \times g(n) - 1 \ldots 0 \leq n \leq L-1 \quad (1)$$

In the above equation (1), L directly represents the transform block length if neighboring transform block lengths remain the same. If the neighboring transform block lengths differ, assuming that a shorter one of the transform block is L and a longer transform block length is K, the following equation (2)

$$f(n) = g(n) = 1 \ldots K \leq n \leq 3K/2 - L/2$$

$$f(n) = g(n) = 0 \ldots 3k/2 + L \leq n \leq 2K \quad (2)$$

Thus, by selecting the window overlapping length to be of a longer length, it become possible to improve the frequency resolution of the spectrum during the orthogonal transform.

It is seen from above that the shape of the window employed for orthogonal transform is determined after the orthogonal transform sizes of three temporally consecutive blocks are determined. Consequently, a difference corresponding to one block is generated between the block of the signals entered at the input terminals 301, 302 and 303 in FIG. 4 and the block of the signals outputted at the output terminals 315, 319.

The block size decision circuits 19, 20 and 21 in FIG. 2 may be constituted with omission of the power calculating circuits 305, 306 and the power comparator circuit 309 in FIG. 4. Furthermore, by using only the temporally smallest possible block size of the orthogonal transform blocks, only one window shape may be used, in which case the groups of the delay units 312 to 314, block size correction circuit 311 and the window shape decision circuit 317 may be omitted. Above all, in a practical application in which delay of the processing time is not desirable, less delay may be advantageously produced by omission of the above components.

By referring to FIGS. 7(A), 7(B), 8(A) and 8(b), the operation of the above-mentioned block size decision circuit 310 is explained.

Figure 7B:
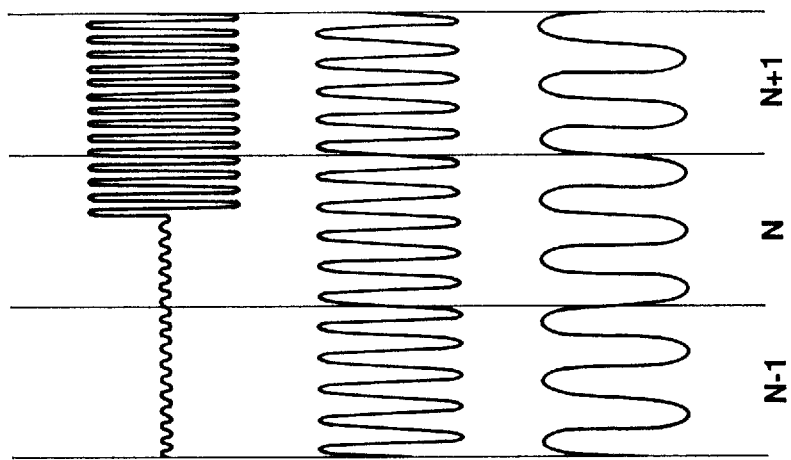
FIGS. 7(A) and 7(B) show the pre-echo masking effect among the functions of the block decision circuit.
Figure 7A:
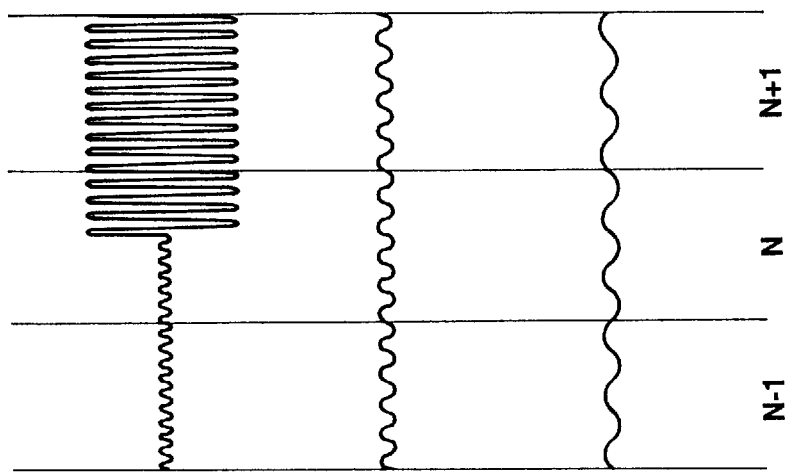

In FIG. 7, it is assumed for simplicity that the input for each band is a single sine wave input and that the same input signals are entered for the band of 11 to 22 kHz for FIGS. 7(A) and 7(B). If the temporal size of the orthogonal transform block for a block N is determined based solely on amplitude changes for the above band, the same block size is set for FIGS. 7(A) and 7(B).

However, if attention is directed to the input signals for the frequency ranges of 0 to 5.5 kHz or of 5.5 kHz to 11 kHz, the energy or power values of the bands other than the band of 11 kHz to 22 kHz are lower than those of the frequency band of 11 to 22 kHz, so that the pre-echo produced in the band of 11 kHz to 22 kHz is not masked and hence problems are raised in connection with the aural sense. Consequently, the block N of the band of 11 kHz to 22 kHz in FIG. 7(A) needs to be selected to be a block of a shorter time duration.

On the other hand, in FIG. 7(B), the energy or power values of the bands of 0 to 5.5 kHz and 5.5 to 11 kHz are large enough to mask the pre-echo, as compared to those of the band of 11 to 22 kHz, so that the pre-echo generated in the band of 11 to 22 kHz is masked without raising problems in connection with the aural sense. Therefore, for FIG. 7(B), it is desirable to place more emphasis on the frequency resolution and to select an orthogonal transform block size which is longer than that in the case of FIG. 7(A).

In the present embodiment, by the operation of the power calculating circuits 305, 306, power comparator circuit 309 and the block size correction circuit 311, shown in FIG. 4, it becomes possible to set the block size for the case of FIG. 7A so as to be different from that for the case of FIG. 7B.

FIGS. 9(A) and 8(B) show a signal undergoing significant amplitude changes periodically and a signal undergoing a sole significant amplitude change, respectively.

For both of these signals, the same input signals are entered between temporally neighboring blocks (N−1) and (N+1). If the temporal size of the orthogonal transform block is determined with an eye directed only to the blocks of from (N−1) to (N+1), the block length for the block N is the same for both FIGS. 8A and 8B.

However, with the signal shown in FIG. 8A, the amplitude changes similar to those for the block N are produced before the block N in a manner of characterizing the present input signals. Consequently, there is a risk of changes in the sound quality being produced in connection with the aural sense if the orthogonal transform block size is set in a manner of disregarding the amplitude changes in the blocks temporally preceding the block N.

Conversely, with the signal shown in FIG. 8B, the amplitude change in the block is a sole change, while analogous amplitude changes are not produced temporally upstream of the block N, so that hindrances to the aural sense are not likely to be produced if the block size for the block L is selected with an eye directed solely to near-by blocks.

In the present embodiment, mistaken decision of the orthogonal transform block size caused by analogous signals is inhibited by the groups of delay units 312 to 314 and the block size correction circuit 311 of FIG. 4.

In the present embodiment, the band division employed before orthogonal transform is directly employed in order to take into account the state of masking by the pre-echo. However, more satisfactory results may be obtained by conducting calculations for masking by employing independent orthogonal transform or by dividing the frequency range into a larger number of bands. Furthermore, periodic temporal changes in the input signals for a longer period of time may be realized in the above embodiment by storing the orthogonal transform block sizes of past blocks by delay units 312 to 314. However, it is possible to produce more satisfactory results by employing data processed with orthogonal transform different from that employed during the compression process or data divided into smaller frequency bands.

Returning to FIG. 2, low frequency components of the frequency-domain spectral data or MDCT coefficient data, obtained on MDCT processing by MDCT circuits 13 to 15, are grouped for each of the critical bands, while mid to high frequency components thereof are sub-divided from the critical bands in consideration of the block floating efficiency and supplied to adaptive bit allocation encoding circuits 22, 23 and 24 and to the bit allocation calculating circuit 18. The critical bands mean the frequency bands divided from the entire audible frequency range in order to take the characteristics of the human aural sense into account, and denote the bands proper to the narrow-band noise which masks a pure tone of the same intensity as the noise and which has the frequency in the vicinity of the noise. With the critical bands, the bandwidths become broader towards the higher frequencies, with the total audible frequency range being divided into 25 critical bands.

The bit allocation calculating circuit 18 calculates, in view of the masking effect, the amounts of masking for each critical band and each band divided from the critical band to take into account the block floating based on the spectral data divided to take into account the above-mentioned critical bands and block floating. Besides, the bit allocation calculating circuit 18 calculates the numbers of allocated bits for the respective bands, based on the energies or peak values for each of the critical bands and the bands divided from the critical bands to take the block floating into account, and on the amounts of masking, and transmits the resulting information to the adaptive bit allocation and encoding circuits 22, 23 and 24. The adaptive bit allocation and encoding circuits 22 to 24 quantize the spectral data or the MDCT coefficient data depending on the numbers of bits allocated to the respective bands in the adaptive bit allocation and encoding circuits 22 to 24. The data encoded in this manner is outputted at output terminals 25 to 27.

Figure 9:
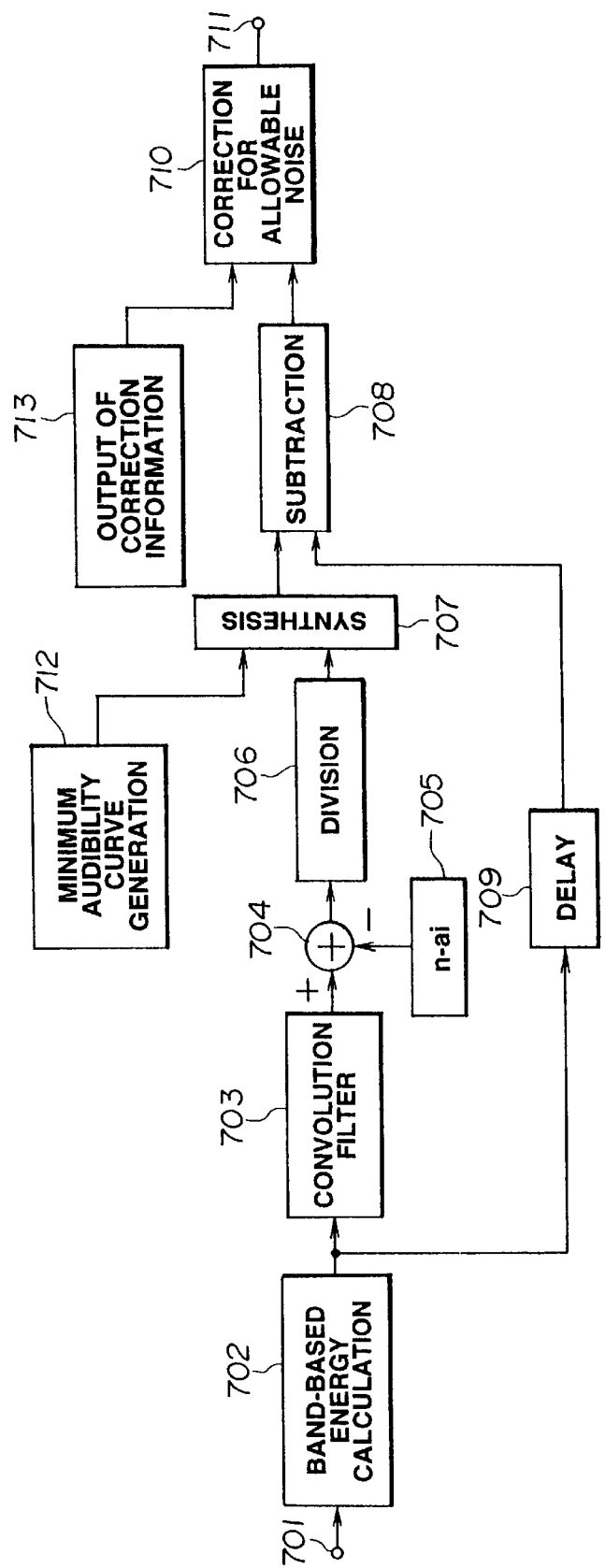
FIG. 9 is a block circuit diagram showing a concrete arrangement for realization of the bit allocation arithmetic-logic function.

FIG. 9 shows, in a schematic block circuit diagram, an arrangement of a concrete embodiment of the bit allocation calculating circuit 18, in which the frequency-domain spectral data from the MDCT circuits 13 to 15 are supplied to an input terminal 701.

Figure 10:
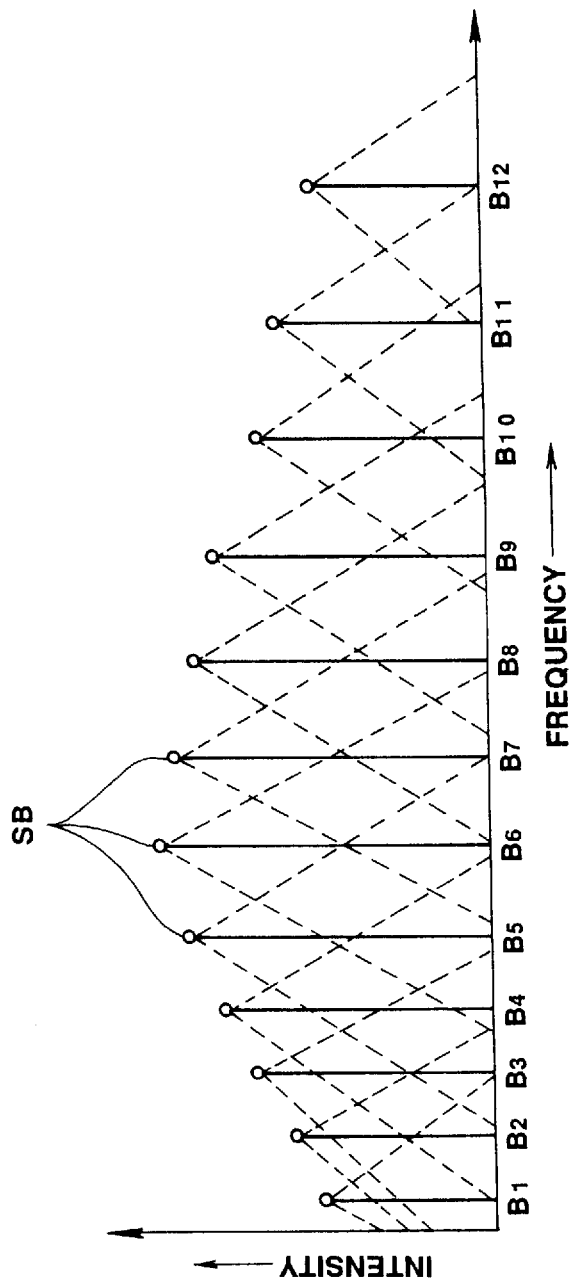
FIG. 10 is a graph showing spectral components for critical bands and bands sub-divided from the critical bands for taking block floating into account.

The frequency-domain input data is transmitted to a band-based energy calculating circuit 702 in which the energies of the critical bands and the bands divided from the critical bands to take into account the block floating and the amounts of masking are found by calculating the sum total of the amplitudes in the respective bands. The amplitude peak values or mean values may also be employed in place of the energies in the respective bands. Each spectral component indicating the sum value of the amplitudes of each of the respective bands is indicated as SB in FIG. 10 as an output of the energy calculating circuit 702. In FIG. 10, 12 bands B1 to B12 are shown as indicating the critical bands and the bands sub-divided from the critical bands to take into account the block floating, and the amounts of masking, for simplifying the drawing.

It is noted that an operation of multiplying each spectral component SB by a pre-set weighting function for taking into account the effects of masking is now performed by way of convolution. To this end, an output of the band-based energy calculating circuit 702, that is each value of the spectral component SB, is transmitted to a convolution filter circuit 703. The convolution filter circuit 703 is made up of a plurality of delay elements for sequentially delaying input data, a plurality of multipliers, such as 25 multipliers associated with the respective bands, for multiplying outputs of the delay elements with filter coefficients or weighting functions, and an adder for finding the sum of the outputs of the respective multipliers. By such convolution, the sum of the portions indicated by broken lines in FIG. 10 is found.

By way of a concrete example of multiplication coefficients or filter coefficients of the respective filters of the convolution filter circuit 703, if the coefficient of a multiplier M for an arbitrary band is 1, outputs of the delay elements are multiplied by coefficients 0.15, 0.0019, 0.0000086, 0.4, 0.06 and 0.007 at the multipliers M−1, M−2, M−3, M+1, M+2 and M+3, M being an arbitrary integer of from 1 to 25, for performing convolution of the spectral components SB.

An output of the convolution filter circuit 703 is transmitted to a subtractor 704 for finding a level $\alpha$ corresponding to the allowable noise level in the convolved region. Meanwhile, the allowable noise level $\alpha$ is such a level which will give an allowable noise level for each of the critical bands by deconvolution as will be described subsequently. The subtractor 704 is supplied with an allowance function (a function representative of the masking level) for finding the level $\alpha$. The level $\alpha$ is controlled by increasing or decreasing the allowance function. The allowance function is supplied from a (N−ai) function generator 705 now to be explained.

That is, the level $\alpha$ corresponding to the allowable noise level is found from the equation (3):

$$\alpha = S - (n - ai) \qquad (3)$$

where $i$ is the number accorded sequentially to the critical bands beginning from the lower side, n and a are constants where a>0 and S the intensity of the convolved Bark spectrum. In the equation (3), (n−ai) represents the allowance function. In the present embodiment, by setting so that n=38 and a=1, optimum encoding may be achieved without deterioration in the sound quality.

The level $\alpha$ is found in this manner and transmitted to a divider 706 for deconvolving the level $\alpha$ in the convolved region. By this deconvolution, the masking spectrum is found from the level $\alpha$. This masking spectrum becomes the allowable noise level. Although the deconvolution necessitates complex arithmetic-logical steps, it is performed in the present embodiment in a simplified manner by using the divider 706.

Figure 11:
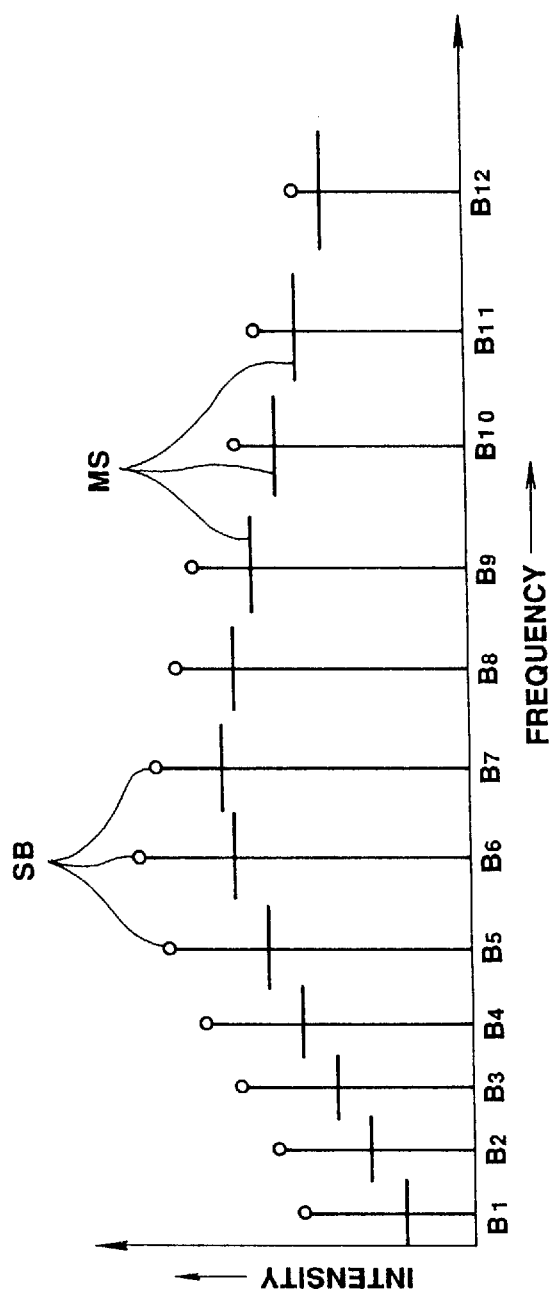
FIG. 11 is a graph showing a masking spectrum.

The masking spectrum is transmitted via a synthesizing circuit 707 to a subtractor 708 which is supplied with an output of the band-based energy detection circuit 702, that is the above-mentioned spectral components SB. The subtractor 708 subtracts the masking spectrum from the spectrum SB for masking the portions of the spectral components SB lower than the level of the masking spectrum MS, as shown in FIG. 11.

An output of the subtractor 708 is outputted via an allowable noise correction circuit 710 at an output terminal 711 and thence transmitted to a ROM, not shown, in which the information concerning the number of the allocated bits is stored previously. The ROM outputs the information concerning the number of allocated bits for each band, depending on an output of the subtraction circuit 708 supplied via an allowable noise correction circuit 710, that is on the level of a difference between the energies of the respective bands and outputs of the noise level setting means. The information concerning the number of the allocated bits is transmitted to the adaptive bit allocation and encoding circuits 22 to 24 to permit the frequency-domain spectral data from the MDCT circuits 13 to 15 (FIG. 2) to be quantized with the numbers of bits allocated to the respective bands.

In sum, the adaptive bit allocation and encoding circuits 22 to 24 (FIG. 2) quantize the band-based spectral data with the numbers of bits allocated depending on the amounts of masking and the level of the difference between the output of the noise level setting means and the energies in the critical bands and the bands divided from the critical bands to take the block floating into account. The delay circuit 709

(FIG. 9) is provided for delaying the spectral components SB from the energy detection circuit 702 in consideration of, the delay produced in the circuitry upstream of the synthesizing circuit 707.

Figure 12:
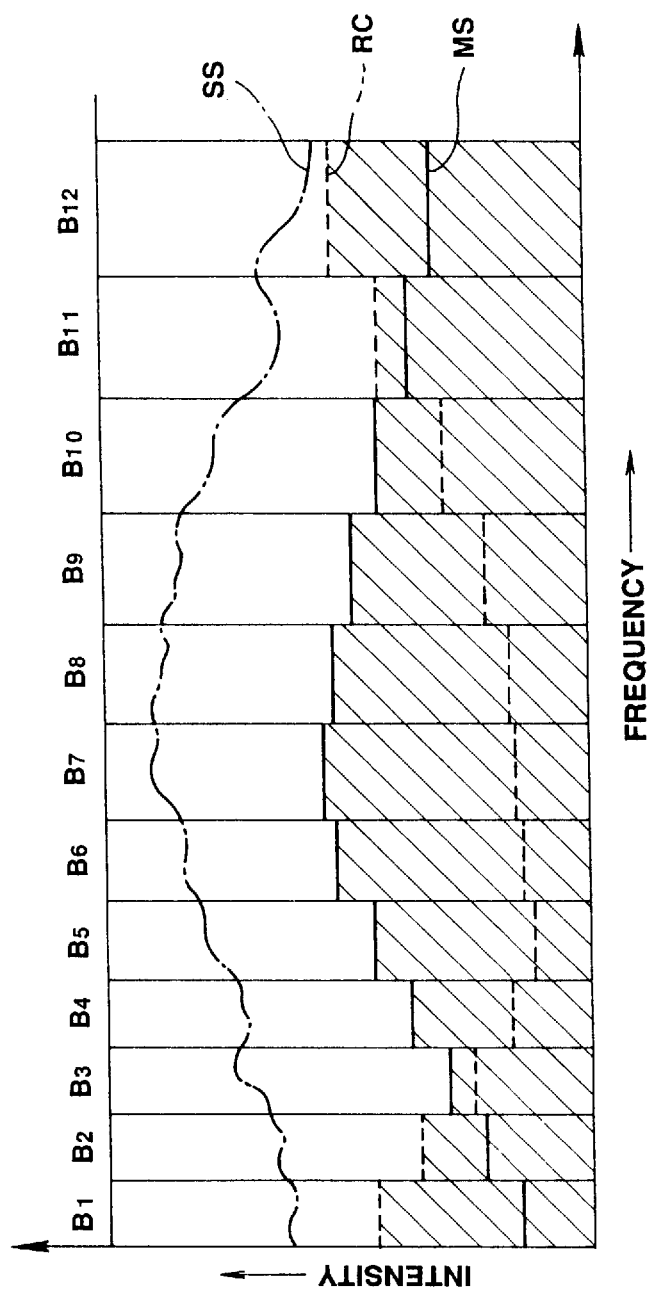
FIG. 12 is a graph showing a minimum audibility curve and the masking spectrum combined together.

The synthesizing circuit 707 synthesizes the masking spectrum MS and data from the minimum audibility curve RC from the minimum audibility curve generating circuit 712 representing characteristics of the human aural sense as shown in FIG. 12. If the absolute noise level is lower than the minimum audibility curve, the noise becomes inaudible. The minimum audibility curve differs with the difference in the replay level even although the coding is made in the same manner. However, since there is no marked difference in the manner of entering into the 16-bit dynamic range in music in actual digital systems, it may be presumed that, if the quantization noise of the frequency range in the vicinity of 4 kHz most perceptible to the ear is not heard, the quantization noise lower than the level of the minimum audibility curve is not heard in any other frequency range.

Assuming that the recording/replay device is employed so that the noise in the vicinity of 4 kHz of a word length owned by the system is not heard, and the allowable noise level is to be obtained by synthesizing the minimum audibility curve RC and the masking spectrum MS, the allowable noise level may be up to the level indicated by hatched lines in FIG. 12. In the present embodiment, the level of 4 kHz of the minimum audibility curve is matched to the minimum level corresponding to e.g. 20 bits. In FIG. 12, the signal spectrum SS is also shown.

Furthermore, the allowable noise correction circuit 710 corrects the allowable noise level in the output of the subtractor 708 based on the information of the equal-loudness curve transmitted from a correction information outputting circuit 713. The equal-loudness curve is a characteristic curve concerning characteristics of human aural sense, and is obtained by finding the sound pressures of the sound at the respective frequencies heard with the same loudness as the pure tone of 1 kHz and by connecting the sound pressures by a curve. It is also known as an equal loudness sensitivity curve. The equal-loudness curve also delineates a curve which is substantially the same as the minimum audibility curve shown in FIG. 12. With the equal-loudness curve, the sound in the vicinity of 4 kHz is heard with the same loudness as the sound of 1 kHz, even although the sound pressure is decreased by 8 to 10 dB from the sound of 1 kHz. Conversely, the sound in the vicinity of 50 kHz cannot be heard with the same loudness as the sound of 1 kHz unless the sound pressure is higher by about 15 db than that of the sound of 1 kHz. Thus it may be seen that the noise in excess of the level of the minimum audibility curve and within the allowable noise level preferably has frequency characteristics represented by a curve conforming to the equal-loudness curve. Thus it can be seen that correction of the allowable noise level in view of the equal-loudness curve is in conformity to the characteristics of the human aural sense.

Meanwhile, the correction information outputting circuit 713 may be designed to correct the allowable noise level based on the information of the error between the detection output of the volume of the output information (data quantity) at the time of quantization at the adaptive bit allocation and encoding circuits 22 to 24 and the target bit rate of the ultimately encoded data. There are occasions where the total number of bits as obtained by temporary adaptive bit allocation for the totality of the bit allocation unit blocks is different from the pre-set number of bits (target number of the bits) as determined by the bit rate of the ultimate encoded data and hence the bit allocation is again made so that the difference becomes equal to zero. That is, if the total number of allocated bits is less than the target number of the bits, the bits corresponding to the difference are additively allocated to respective unit blocks, whereas, if the total number of allocated bits is larger than the target number of the bits, the bits corresponding to the difference are deductively allocated to the respective unit blocks.

To this end, an error of the total number of allocated bits from the target number is detected and correction data for correcting the number of allocated bits is outputted by the correction information output circuit 713 depending on the error data. If the error data indicates the shortage of the number of bits, it is probable that more bits are employed per unit block so that the amount of the data is in excess of the target number of bits. If the error data indicates an excess of the number of bits, it is probable that a smaller number of bits per unit block suffices so that the amount of the data is less than the target number. Consequently, the correction information outputting circuit 713 is responsive to the error data to output the data of correction values by which the allowable noise level at an output of the subtractor 708 is corrected based on the information of the equal-loudness curve. The correction values are transmitted to the allowable noise correction circuit 710 for correcting the allowable noise from the subtractor 708. With the above-described system, data obtained by processing the orthogonal transform output spectrum by the subsidiary information for quantization is obtained as the main information, while the scale factor indicating the state of block floating or the word length data are produced as the subsidiary information for quantization. The main information and the subsidiary information are transmitted from the encoder to the decoder.

Figure 13:
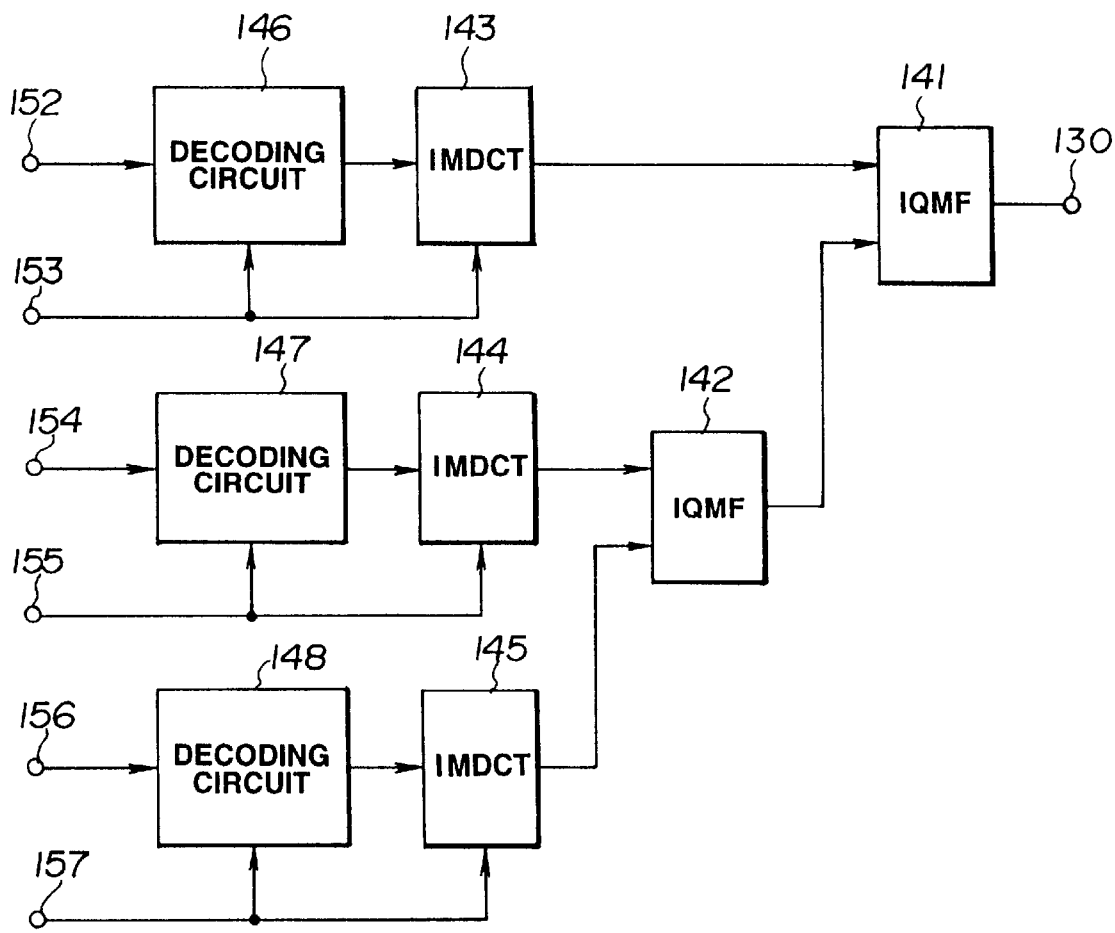
FIG. 13 is a block circuit diagram showing a concrete example of a decoder associated with high efficiency compression coding which may be employed for bit rate compression coding with the embodiment shown in FIG. 1.

FIG. 13 shows the ATC decoder 73 shown in FIG. 1, that is decoding circuits for re-combining the above-mentioned high efficiency encoded signals. The quantized MDCT signals of the respective bands, that is data equivalent to the output signals at the output terminals 25 to 27 in FIG. 2, are supplied to input terminals 152, 154 and 156, respectively, while the block size information, that is data equivalent to output signals at the output terminals 28 to 30 in FIG. 2, are supplied to input terminals 153, 155 and 157, respectively. Decoding circuits 146, 147 and 148 annul the bit allocation using the adaptive bit allocation information. The frequency-domain signals are transformed by IMDCT circuits 143, 144 and 145 into time-domain signals. These partial range time domain signals are decoded by IQMF circuits 142 and 141 into full-range signals which are outputted at an output terminal 130.

The present invention is not limited to the above-described embodiments. For example, the two recording/replay media may be interconnected by a data transfer cable without it being necessary to have the two media built into one system. The present-invention may be applied not only to audio PCM signals but also to digital speech signals or digital video signals. The synthesis of the above-mentioned minimum audibility curve may also be omitted, in which case the minimum audibility curve generating circuit 712 or the synthesizing circuit 707 may be omitted and an output of the subtractor 704 may be directly transmitted to the subtractor 708 after deconvolution by the divider 706. Besides, a wide variety of bit allocation techniques may be employed, such as the fixed bit allocation, bit allocation based on signal band energies or bit allocation consisting of the combination of the fixed bit allocation and the variable bit allocation.

It is seen from above that the present invention provides a technique of selecting the temporal size of the processing block whereby the temporal size of the processing block desirable in connection with the aural sense may be set when it is desired to compress information signals experiencing temporal fluctuations for assuring high efficiency compression and expansion with superior sound quality as perceived by the ears.

What is claimed is:

1. A device for recording and/or reproducing or transmitting and/or receiving compressed data in which, during compression and/or expansion of digital signals, a length of a processing block for orthogonal transformation is rendered variable responsive to input signals, comprising:

means for setting the length of a subject processing block in a relevant frequency band of a plurality of frequency bands based upon changes in a value of one of power, energy and amplitude of the input signals of said subject processing block and the input signals of at least one other processing block in the relevant frequency band;

means for comparing a value of one of power, energy and amplitude of each of the plurality of frequency bands for a time duration to determine the masking effect on the relevant frequency band by other of the plurality of frequency bands; and means for correcting the length of the subject processing block based upon the masking information.

2. The device of claim 1, wherein the means for correcting the length of the subject processing block corrects the length of the subject processing block based upon information on changes in those input signals having a longer time width than that of a longest of the processing blocks.

3. The device of claim 1 or 2, wherein the apparatus performs at least one of recording and reproducing and at least one of transmitting and receiving.

4. The device of claim 1, wherein a proportion of elements utilized in deciding the length of the processing block is one of fixed or adaptively changed in response to the input signals.

5. The device for recording and/or reproducing or transmitting and/or receiving compressed data of claim 1, 2 or 4, wherein the input signals are audio signals, further comprising:

means for selecting a frequency width of at least a majority of control blocks to be broader towards higher frequencies to control generation of quantization noise.

6. The device of claim 1, further comprising:

an orthogonal transformer for dividing time-domain signals into frequency-domain signals of plural frequency bands, wherein the length of the subject processing block and a shape of a window function employed during the dividing are changed.

7. The device of claim 6, wherein the orthogonal transformer, in dividing time-domain signals into plural bands in the frequency-domain, forms blocks each comprising plural samples for each of the plural bands, each block comprising plural samples is orthogonally transformed to produce coefficient data, further comprising:

an inverse orthogonal transformer for converting the plural bands in the frequency-domain into time-domain signals, wherein an inverse orthogonal transform is executed for each of the blocks for each of the plural bands; and a synthesizer for forming synthesized signals in the time-domain from the inverse orthogonally transformed blocks.

8. The device of claim 7, wherein at least one of frequency widths of the plural bands in the frequency-domain as divided from the time-domain signals yet to be orthogonal transformed and the frequency widths of the plural bands in the frequency-domain after inverse orthogonal transform yet to be synthesized into time-domain signals are selected to be broader substantially towards higher frequencies.

9. The device of claim 8, wherein at least one of the frequency widths of the plural bands in the frequency-domain as divided from the time-domain signals yet to be orthogonal transformed and the frequency widths of the plural bands in the frequency-domain after inverse orthogonal transform yet to be synthesized into time-domain signals are set so as to be the same for two consecutive lower most bands.

10. The device of claim 9, wherein during the compression of the digital signals at least one of main information and subsidiary information in compression coding is allocated to signal components of the bands substantially within the signal pass-bands.

11. The device claim 6, 7, 8, 9 or 10, wherein the orthogonal transformer comprises:

a modified discrete cosine transformer.

12. The device of claim 7, 8 or 9, further comprising:

at least one quadrature mirror filter for converting the input signals into said time-domain signals of plural bands.

13. The device of claim 1, wherein the length of the subject processing block is a temporal length, and the temporal length is determined based upon changes in input signals of said processing block, and boundary values thereof are rendered variable depending on an amplitude and a frequency of the input signals.

14. The device of claim 13, wherein the boundary values of the temporal length as determined based on changes in the input signals assume plural step-shaped values depending upon the amplitude and the frequency of the input signals.

15. The device of claim 13, wherein at least one of periodic changes, repetitive pulses and repetitive features in the input signals are utilized to determine the temporal length of the processing block.

16. The device of claim 1, wherein aural effects of said signals of said at least one other processing block on the signals of the subject processing block are calculated using information concerning at least one of a spectrum on a frequency axis, energies, powers of orthogonal transform coefficients and peak information to determine a temporal length of the subject processing block.

17. The device of claim 16, wherein at least one of the frequency-domain spectrum and the orthogonal transform coefficients are used in conjunction with a time-domain spectrum resulting from at least one of orthogonal transform and orthogonal transform coefficients used for bit allocation for at least one of compression and block floating.

18. A method for recording and/or reproducing or transmitting and/or receiving compressed data in which, during compression and/or expansion of digital signals, a length of a processing block for orthogonal transformation is rendered variable responsive to input signals, comprising the steps of:

setting the length of a subject processing block in a relevant frequency band of a plurality of frequency bands based upon changes in a value of one of power, energy and amplitude of the input signals of said subject processing block and the input signals of at least one other processing block;

comparing a value of one of power, energy and amplitude of each of the plurality of frequency bands for a time duration to determine the masking effect on the relevant frequency band by other of the plurality of frequency bands; and correcting the length of the subject processing block based upon the masking information.

19. The method of claim 18, wherein the step of correcting the length of the subject processing block corrects the length of the subject processing block based upon information on changes in those input signals having a longer time width than that of a longest of the processing blocks.

20. The method of claim 18 or 19, wherein at least one of recording and reproducing and at least one of transmitting and receiving is performed.

21. The method of claim 18, wherein a proportion of elements utilized in deciding the length of the processing block is one of fixed or adaptively changed in response to the input signals.

22. The method of claim 18, 19 or 21, wherein the input signals are audio signals, further comprising the step of:

selecting a frequency width of at least a majority of control blocks to be broader towards higher frequencies to control generation of quantization noise.

23. The method of claim 18, further comprising the step of:

orthogonally transforming to dividing time-domain signals into frequency-domain signals of plural frequency bands, wherein the length of the subject processing block and a shape of a window function employed during the dividing are changed.

24. The method of claim 23, wherein the step of orthogonally transforming, in dividing time-domain signals into plural bands in the frequency-domain, forms blocks each comprising plural samples for each of the bands, each block comprising plural samples is orthogonally transformed to produce coefficient data, further comprising the steps of:

converting the plural bands in the frequency-domain into time-domain signals, wherein an inverse orthogonal transform is executed for each of the blocks for each band; and forming synthesized signals in the time-domain from the inverse orthogonally transformed blocks.

25. The method of claim 24, wherein at least one of frequency widths of the plural bands in the frequency-domain as divided from the time-domain signals yet to be orthogonal transformed and the frequency widths of the plural bands in the frequency-domain after inverse orthogonal transform yet to be synthesized into time-domain signals are selected to be broader substantially towards higher frequencies.

26. The method of claim 25, wherein at least one of the frequency widths of the plural bands in the frequency-domain as divided from the time-domain signals yet to be orthogonal transformed and the frequency widths of the plural bands in the frequency-domain after inverse orthogonal transform yet to be synthesized into time-domain signals are set so as to be the same for two consecutive lower most bands.

27. The method of claim 26, wherein during the compression of the digital signals at least one of main information and subsidiary information in compression coding is allocated to signal components of the bands substantially within the signal pass-bands.

28. The method of claim 23, 24, 25, 26 or 27, wherein the orthogonal transformation comprises the step of:

modified discrete cosine transforming.

29. The method of claim 24, 25 or 26, further comprising the step of:

converting with a quadrature mirror filter the input signals into said time-domain signals of plural bands.

30. The method device of claim 18, wherein the length of the subject processing block is a temporal length, and the temporal length is determined based upon changes in input signals of said processing block, and boundary values thereof are rendered variable depending on an amplitude and a frequency of the input signals.

31. The method of claim 30, wherein the boundary values of the temporal length as determined based on changes in the input signals assume plural step-shaped values depending upon the amplitude and the frequency of the input signals.

32. The method of claim 30, wherein at least one of periodic changes, repetitive pulses and repetitive features in the input signals are utilized to determine the temporal length of the processing block.

33. The method of claim 18, wherein aural effects of said signals of said at least one other processing block on the signals of the subject processing block are calculated using information concerning at least one of a spectrum on a frequency axis, energies, powers of orthogonal transform coefficients and peak information to determine a temporal length of the subject processing block.

34. The method of claim 33, wherein at least one of the frequency-domain spectrum and the orthogonal transform coefficients are used in conjunction with a time-domain spectrum resulting from at least one of orthogonal transform and orthogonal transform coefficients used for bit allocation for at least one of compression and block floating.

35. A recording medium on which a compressed digital signal is recorded, wherein a length of a processing block for orthogonal transformation is rendered variable responsive to input signals, wherein the compressed digital signal is generated by a method comprising the steps of:

setting the length of a subject processing block based upon changes in a value of one of power, energy and amplitude of the input signals of said subject processing block and the input signals of at least one other processing block;

and correcting the length of the subject processing block based upon masking information.

* * * * *